United States Patent [19]

Berg et al.

[11] 4,329,190

[45] May 11, 1982

[54] PROCESS FOR ATTACHING OPTICAL FIBER TO SEMICONDUCTOR DIE

[75] Inventors: Howard M. Berg, Scottsdale; Gary L. Lewis, Peoria, both of Ariz.

[73] Assignee: Motorola, Inc., Schaumburg, Ill.

[21] Appl. No.: 45,903

[22] Filed: Jun. 6, 1979

[51] Int. Cl.³ .......................... G02B 7/26; H01L 31/12
[52] U.S. Cl. ....................................... 156/60; 156/293; 156/322; 357/17
[58] Field of Search .......................... 156/60, 293, 322; 357/17

[56] References Cited

U.S. PATENT DOCUMENTS 4,058,821  11/1977  Miyoshi et al. .................... 357/17 X
4,100,562  7/1978  Sugawara et al. ................. 357/17 X

*Primary Examiner*—James R. Hoffman
*Attorney, Agent, or Firm*—Paul F. Wille

[57] ABSTRACT

A process is described for attaching optical fiber to a semiconductor die in which a first droplet of adhesive is applied to the die and partially gelled to form a cushion for receiving the end of the optical fiber to be attached thereto.

10 Claims, 4 Drawing Figures

PROCESS FOR ATTACHING OPTICAL FIBER TO SEMICONDUCTOR DIE

BACKGROUND OF THE INVENTION

This invention relates to the manufacture of semiconductor devices and, in particular, to the manufacture of light emitting and light sensitive semiconductor devices including segments of optical fiber.

As used herein, "optical fiber" refers to one or more strands, e.g. 2 mm (0.2 inch) or less in diameter, of light conducting material, e.g. glass or transparent polymers. "Light" is intended to include both the spectrum visible to human beings as well as wavelengths to which semiconductive materials are or can be made sensitive.

In copending application Ser. No. 952,189, filed Oct. 16, 1978, and assigned to the assignee of the present invention, a fiber optic active element interface connector is described in which a ferrule is mounted over a semiconductor device to hold a segment of optical fiber in position over the semiconductor die and to act as a connector to passive portions of an optical communications system. While providing distinctly improved performance over other types of devices in the art, the alignment of the end of the fiber with the light emitting portion of the die requires careful assembly techniques.

The care required in assembly results from two broad, slightly overlapping, considerations; namely the mechanics of manufacturing and using the device and optical performance. The optical fiber must be precisely aligned along three perpendicular axes with the active area of the semiconductor for good optical coupling. However reliability considerations dictate that the fiber must not touch the die. During manufacture and use, the die and package encounter widely varying temperatures and temperature gradients. Since the fiber and plastic package materials have significantly different temperature coefficients of expansion, the fiber must be positioned slightly above the die so that contact is not made even when the die is warm or when a large temperature gradient exists in the package, since this would damage the surface of the die and degrade optical performance. Conversely, too great a distance between the end of the fiber and the die also degrades optical performance.

Prior art techniques in which the fiber touches the die and is withdrawn slightly, with or without an uncured adhesive, may damage the die. Alternatively, positioning the fiber without contact and then applying an adhesive may result in the fiber being moved laterally by the adhesive. Since optical coupling between the die and the fiber is much more sensitive to lateral displacement than to axial displacement of the fiber, the latter method is least desirable.

SUMMARY OF THE INVENTION

In view of the foregoing, it is therefore an object of the present invention to provide an improved method for attaching an optical fiber to a semiconductor die.

Another object of the present invention is to provide a method for attaching an optical fiber to a die in which alignment of the fiber to the active portion of the die is maintained during manufacture.

A further object of the present invention is to provide a method for attaching an optical fiber to a semiconductor die without mechanical damage to the die.

Another object of the present invention is to provide more efficient coupling from a light emitting or light detecting semiconductor device to a segment of optical fiber.

A further object of the present invention is to provide an improved method for manufacturing fiber optic semiconductors having a ferrule.

Another object of the present invention is to provide an improved method for attaching an optical fiber to a die which can be accomplished at high manufacturing speeds.

A further object of the present invention is to provide a resilient attachment of a fiber to a semiconductor die.

The foregoing objects are achieved in the present invention wherein a first droplet of uncured polymer is applied to the semiconductor die, forming a coating of predetermined thickness on the die, partially curing or gelling the die coating, applying a second droplet of uncured polymer to the polished or cleaved end of the optical fiber to be attached to the die, laterally aligning the fiber, bringing the two droplets into contact, and curing the polymer. The fiber optic semiconductor is completed by applying potting compound to both the die and the ferrule, inserting the fiber and die into the ferrule to join the two, curing the potting compound, and polishing the fiber end of the ferrule to form a single, planar surface.

A more complete understanding of the present invention can be obtained by considering the following detailed description in conjunction with the accompanying drawings in which.

DESCRIPTION OF THE PREFERRED EMBODIMENT

Figure 1:
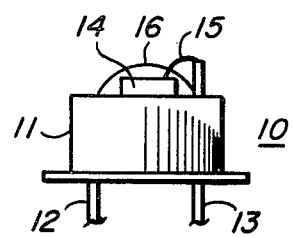
FIG. 1 illustrates a die coated in accordance with the present invention.

In accordance with a preferred embodiment of the present invention, FIG. 1 illustrates a header after the first step of the process in accordance with the present invention has been performed. Specifically, header 10 comprises a cap portion 11 having electrodes 12 and 13 attached thereto and electrically connected to die 14, which is soldered, brazed or otherwise suitably attached to the top surface of cap 11. A controlled drop of colorless polymer 16 is applied to die 14, whereupon the droplet spreads over the die and has a thickness over the die of approximately 25 microns (1 mil).

The die coating may comprise any polymer meeting the following characteristics. Since the polymer is in intimate contact with the die, it is desirable that the polymer be of high purity and low water absorption to insure reliability of the semiconductor device. The polymer should also be colorless or transparent to assure maximum light-coupling efficiency. When cured, the polymer should have high resilience or flexibility to enable the fiber to move slightly relative to the chip during subsequent manufacturing operations and during temperature changes in the operation of the device. The polymer should also exhibit moderate adhesion to gold, silicon and glass in order to bond to these surfaces. In addition, the polymer should be bubble-free to assure reliability of the attachment. Further, the polymer should have a rapid cure at elevated temperatures so that assembly can be rapid.

Among the polymers suitable for use in the present invention are silicones designated as GE-261, manufactured by General Electric Company, D.C.6101 and D.C.6103, manufactured by Dow-Corning Corp. Of these three, the GE-261 is preferred.

In a preferred embodiment of the present invention, the partial curing is effected by placing the first droplet on a warmed die, e.g. a die at a temperature of about 135° C. If the GE-261 silicon is used, gelling takes place in about 4 seconds. At this point, the coating on the die is not fully cured but can resist puncturing by the optical fiber. Similarly, if UV (ultraviolet) curable polymer were used, the exposure to a source of ultraviolet light is long enough to gell, but too short to fully cure, the polymer.

Figure 2:
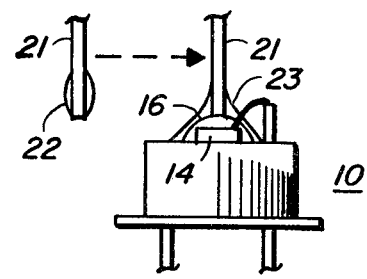
FIG. 2 illustrates attaching the fiber to the die.

FIG. 2 illustrates the next step in accordance with the present invention in which a droplet 22 is applied to the end of optical fiber 21 at ambient temperature, e.g. by dipping the end in polymer to a specified depth. Fiber 21 is then laterally aligned above header 10, which is maintained at 135° C., and gently lowered such that droplet 22 contacts coating 16, spreading thereover. Fiber 21 is held in position until the spread out droplet gels in 3-5 seconds and reaches its final form represented in FIG. 2 as layer 23. At this point, optical fiber 21 is precisely located laterally and axially by virtue of the repeatable thickness of coating 16 and is essentially permanently attached to header 10, i.e. the gelled die coat is strong enough to support the fiber segment. Fiber 21 is then released and the coating and droplet are fully cured, for example, by heating in an oven to a temperature of approximately 150° C. for a period of 30 minutes. The particular time and temperature combination can be varied widely, although lower temperatures will increase considerably the time for full cure.

In addition to providing an approximately 25 micron gap between the end of the optical fiber and the chip surface, coating 16 also serves to control the flow of the second droplet of polymer over the surface of the die as well as causing the droplet to flow downward despite the surface tension effects causing it to wick up the fiber. These several functions greatly facilitate the assembly of the fiber to the header.

It is not necessary that the alignment be carried out with droplet 22 on the end of fiber 21. The alignment may precede applying a droplet to the end of fiber 21. For extremely critical work, this may be preferred. The tradeoff is the increased difficulty in providing a droplet at the end of fiber 21 after the fiber is laterally aligned. This can be accomplished, for example, by using a second fiber to apply the droplet to the end of the aligned fiber. The remainder of the assembly is then the same.

Figure 3:
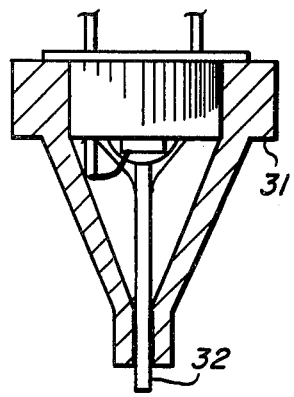
FIG. 3 illustrates a header mounted in a ferrule.

FIG. 3 illustrates the final assembly of the header into a ferrule. Specifically, an inverted ferrule is filled with potting compound, e.g. OS-1600 as manufactured by Hysol. In addition, it is preferred to apply a drop of the potting compound to the surface of header 10, over the die coating, to minimize bubbles in the package. Header 10 and fiber 21 are then carefully inserted into the inverted ferrule and the potting compound cured. Fiber 21 is sufficiently long that the other end 32 of fiber 21 protrudes from the top of ferrule 31.

Figure 4:
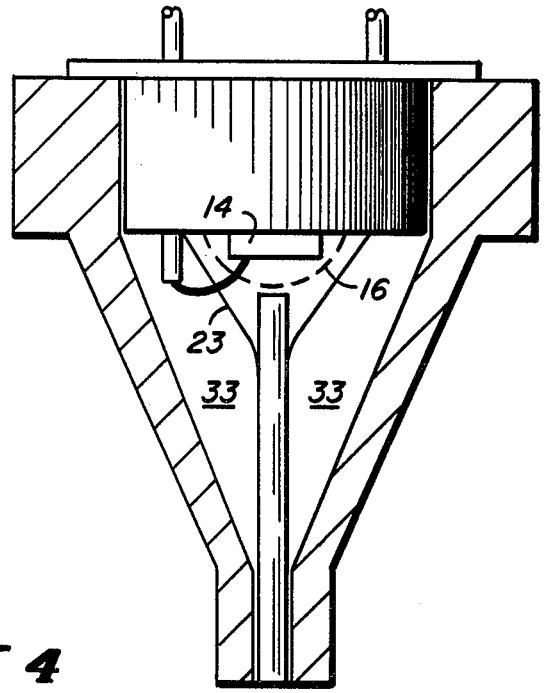
FIG. 4 illustrates a completed fiber optic semiconductor device.

FIG. 4 illustrates a completed device in accordance with the present invention in which end 32 and the top of ferrule 31 have been polished flat to provide a reference surface for mating with a suitable connector.

There is thus provided by the present invention an improved process for attaching optical fibers to semiconductor dice as well as an improved device resulting therefrom. The lateral alignment of the fiber is readily accomplished, even with the droplet 21 in place, to within less than ±25 microns (1 mil). Different rates of expansion of the various package components in response to temperature changes do not materially affect the alignment due to the separation between the end of fiber 21 and semiconductor die 13. This spacing is readily and uniformly obtained through the use of the die coating.

Having thus described the invention, it will be apparent to those of skill in the art that various modifications can be made within the spirit and scope of the present invention. For example, while illustrated in a preferred embodiment utilizing what is known in the art as a TO-18 case as the header, other style headers may be used as well. As previously indicated, the sequence in which the steps are performed can be varied somewhat to adapt to the precision which with the alignment must be performed. Further, the particular temperatures and times noted are for example only. A polymer which can be partially cured in ten seconds or less is required from a manufacturing viewpoint. Other curing parameters are readily determined empirically.

We claim:

1. A method for attaching an optical fiber to a semiconductor device comprising the steps of:
   coating a semiconductor die with an uncured polymer and partially curing said coating;
   applying a droplet of uncured polymer to the end of the optical fiber to be attached to said die;
   bringing said coating and said droplet into contact so that said droplet spreads over said coating;
   partially curing said droplet insitu; and
   fully curing said droplet and coating.

2. The method as set forth in claim 1 wherein said coating is partially cured by warming said die.

3. The method as set forth in claim 2 wherein said coating step is preceded by the step of warming said die.

4. The method as set forth in claim 3 wherein said droplet is partially cured by warming said die.

5. The method as set forth in claim 4 wherein said die is maintained warm through all steps preceding partially curing said droplet.

6. The method as set forth in claim 3 further comprising the step of:
   laterally aligning said optical fiber with a predetermined portion of said semiconductor die.

7. The method as set forth in claim 6 wherein said bringing step comprises:
   axially moving said optical fiber into contact with said partially cured coating.

8. The method as set forth in claim 7, wherein said aligning step precedes the step of axially moving said optical fiber.

9. The method as set forth in claim 3 and further comprising the steps of:
   filling a ferrule with organic potting compound;
   inserting said fiber and die into said ferrule; and
   curing said potting compound.

10. The method as set forth in claim 9 wherein said inserting step is preceded by applying a drop of organic potting compound to said die.

* * * * *